United States Patent
Reuter et al.

(10) Patent No.: US 9,236,358 B2
(45) Date of Patent: Jan. 12, 2016

(54) INTEGRATED CIRCUIT PACKAGE

(75) Inventors: Ralf Reuter, Munich (DE); Saverio Trotta, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/240,765

(22) PCT Filed: Aug. 31, 2011

(86) PCT No.: PCT/IB2011/053811
§ 371 (c)(1),
(2), (4) Date: Feb. 25, 2014

(87) PCT Pub. No.: WO2013/030624
PCT Pub. Date: Mar. 7, 2013

(65) Prior Publication Data
US 2014/0191377 A1  Jul. 10, 2014

(51) Int. Cl.
*H01L 23/66* (2006.01)
*H01P 5/10* (2006.01)
*H01P 3/00* (2006.01)
*H01L 23/00* (2006.01)
*H01L 23/498* (2006.01)

(52) U.S. Cl.
CPC  *H01L 23/66* (2013.01); *H01P 5/10* (2013.01); *H01L 23/49822* (2013.01); *H01L 24/13* (2013.01); *H01L 24/16* (2013.01); *H01L 2223/6627* (2013.01); *H01L 2223/6677* (2013.01); *H01L 2224/131* (2013.01); *H01L 2224/16225* (2013.01); *H01L 2924/19032* (2013.01); *H01L 2924/19051* (2013.01); *H01P 3/003* (2013.01)

(58) Field of Classification Search
CPC ............. H01P 3/003; H01P 5/10; H01P 3/08; H01L 23/66; H01L 2223/6627; H01L 2223/6677; H01L 2224/131; H01L 2224/16225; H01L 23/49822; H01L 24/13; H01L 24/16; H01L 2924/19032; H01L 2924/19051
USPC ........ 333/24 R, 25, 26, 247, 5, 246; 257/664, 257/728
See application file for complete search history.

(56) References Cited

U.S. PATENT DOCUMENTS

| | | | | |
|---|---|---|---|---|
| 6,057,600 | A * | 5/2000 | Kitazawa | H01L 23/66 257/691 |
| 6,097,607 | A * | 8/2000 | Carroll et al. | 361/752 |
| 6,678,540 | B2 * | 1/2004 | Wire et al. | 505/210 |

(Continued)

FOREIGN PATENT DOCUMENTS

JP  09-036171 A  2/1997

OTHER PUBLICATIONS

International Search Report and Written Opinion correlating to PCT/IB2011/053811 dated May 1, 2012.

(Continued)

*Primary Examiner* — Benny Lee
*Assistant Examiner* — Jorge Salazar, Jr.

(57) ABSTRACT

An integrated circuit package comprising a substrate and at least one semiconductor die is described. A connection unit may provide electrical connections between the substrate and the semiconductor die. The connection unit may comprise a stack of conduction layers and isolation layers stacked atop each other. The stack may include a microstrip line or a coplanar waveguide. The microstrip line or the coplanar waveguide may be part of a balun, a power divider, or a directional coupler.

14 Claims, 6 Drawing Sheets

(56) References Cited

U.S. PATENT DOCUMENTS

2002/0074654 A1 6/2002 Koriyama
2003/0040440 A1 2/2003 Wire et al.
2008/0128916 A1 6/2008 Soejima et al.

OTHER PUBLICATIONS

STATSChipPAC: "CSMP-IPD, Chip Scale Module Package—Integrated Passive Device", www.statschippac.com, pp. 1-2, Mar. 2010.

* cited by examiner

INTEGRATED CIRCUIT PACKAGE

CROSS-REFERENCE TO RELATED APPLICATION

The present application claims priority to international patent application PCT/IB2011/053811 filed on Aug. 31, 2011.

FIELD OF THE INVENTION

This invention relates to an integrated circuit package

BACKGROUND OF THE INVENTION

A semiconductor die usually has a plurality of contact pads via which electrical signals may be fed to or received from the die. Various methods of electrically connecting the die to the substrates are known in the art. Such methods include wire bonding and flip chip bonding. For packages, it is notably known to arrange a redistribution layer inside the package, on one side of the die. A redistribution layer serves as an interface between contact pads of the die and contact pads of the substrate. A redistribution layer may be stacked directly on the die. More generally, a connection unit may be arranged as an interface between the die and the substrate. The connection unit may comprise a stack of several redistribution layers stacked atop each other.

A die may also be referred to as a chip. A die may contain one or more integrated circuits. A die may be housed in a housing. An assembly comprising a housing and one or more dies arranged therein may also be referred to as a chip. An assembly comprising one or more chips connected to a substrate is known as a package. The fabrication of such packages is known as packaging.

One such packaging technique is known as redistributed chip packaging (RCP). Redistributed chip packaging is notably used for various applications. The usable frequency range can go from DC beyond hundreds of gigahertz, as in radar transmission or reception circuits, for example. RCP notably allows an integration of multiple chips in one package. A single package may include several redistribution layers, typically up to five redistribution layers. An integration of lumped passive components is also possible. Such passive components may include, for example, quartz crystals, capacitors, and surface-mounted devices (SMD).

SUMMARY OF THE INVENTION

The present invention provides an integrated circuit package as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
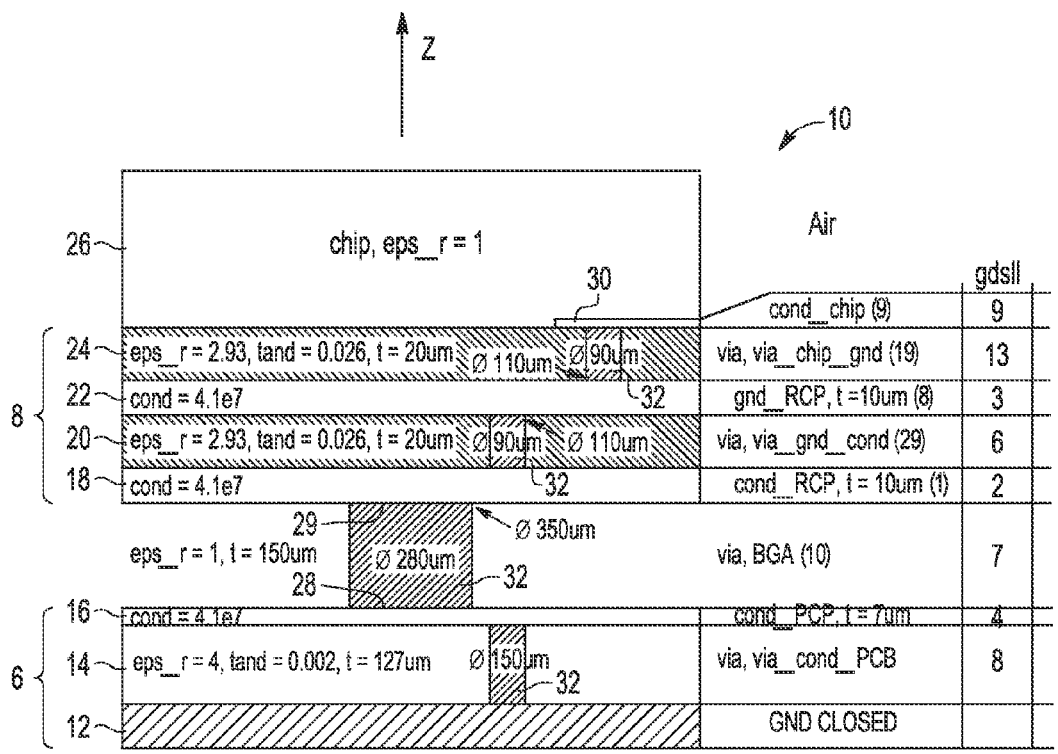
FIG. 1 schematically shows an example of an embodiment of an integrated circuit package.

FIG. 1 shows a cross section of an integrated circuit package 10. The package 10 may, for example, be a redistributed chip package. The package 10 may comprise a substrate 6, a connection unit 8, and a semiconductor die 26. The connection unit 8 may provide electrical connections between the substrate 6 and the semiconductor die 26. The connection unit 8 may thus serve as an interface for transferring electrical signals between the substrate 6 and the die 26. Although only one die 26 is shown in the figure, more than one die may be arranged on the connection unit 8.

The connection unit 8 may comprise a stack of one or more conduction layers and of one or more isolation layers. The conduction layers and the isolation layers may be stacked atop each other in an alternating manner. A conduction layer is a layer that comprises at least one conductive element extending in a planar direction of the layer. An isolation layer is a layer for electrically isolating two conduction layers from each other. An isolation layer may be made of a non-conductive (isolating) material, for example, a polymeric material. An isolation layer may notably comprise a dielectric material. An isolation layer may be traversed by one or more transverse conductors. Such transverse conductors may interconnect two or more conduction layers that are separated by one or more isolation layers.

In the example, the substrate 6 may comprise, in this order, a first conduction layer 12, a first isolation layer 14 and a second conduction layer 16. The layers 12, 14, and 16 may be stacked atop each other in this order. The first conduction layer 12 may comprise a ground plane. The ground plane may be used to define a ground potential for the integrated circuit package 10. The second conduction layer 16 may comprise a printed circuit board (PCB). The conduction layer 16 may have one or more contact pads via which it may be electrically connected to the connection unit 8.

The connection unit 8 may comprise, in this order, a first conduction layer 18, a first isolation layer 20, a second conduction layer 22, and a second isolation layer 24. These layers may be stacked atop one another in this order. In the shown example, the die 26 is directly stacked on the second conduction layer 24.

The die 26 may be connected to the first conduction layer 12 of the substrate 6, e.g. via a transverse conductor 32, e.g., via a solder ball. The transverse conductor 32 may comprise one or more segments, each segment traversing one of the isolation layers, for example, in the stack direction z. The stack direction z may be perpendicular to the main surfaces of the generally flat layers of the connection unit 8. In the example, the transverse conductor 32 may connect a ground plane in the first conduction layer 12 of the substrate 6 via a contact pad 28 and a contact pad 29 of the first conduction layer 18 of the connection unit 8 to a contact pad 30 of the die 26. Each segment of the transverse conductor 32 may, for example, comprise one or more solder bumps. The package 10 may comprise further transverse conductors (not shown) for interconnecting at least two of the described conduction layers or for connecting one of the conduction layers to the die 26. These transverse conductors may be similar in principle to the transverse conductor 32 described above.

The first conduction layer 18 and the second conduction layer 22 may together provide a microstrip line, as will be described further with additional reference to FIGS. 2 to 7.

Figure 2:
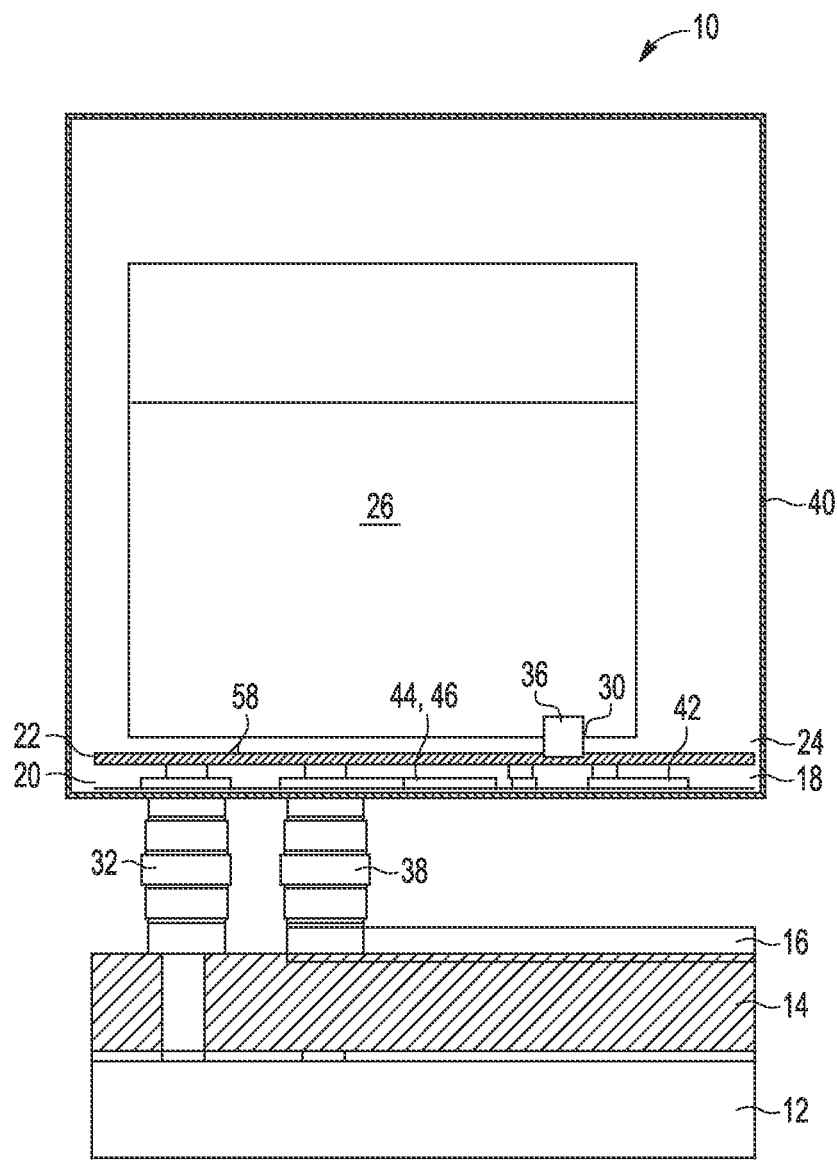
FIG. 2 schematically shows an example of an embodiment of the package of FIG. 1.

FIG. 2 shows another cross-sectional view of the integrated circuit package 10. In the example, the die 26 and the connection unit 8 may be arranged in a common housing 40. The first conduction layer 18 may comprise a microstrip conductive line 42, 44, 46. The microstrip conductive line 42, 44, 46 may be connected to the second conduction layer 16 of the substrate 6. The second conduction layer 22 of the connection unit 8 may comprise a ground plane 58. The ground plane 58 may be connected to the first conduction layer 12 of the substrate 6 via the transverse conductor 32. The microstrip conductive line 42, 44, 46 may be connected to the contact pad 30 of the die 26. The ground plane 58 may be connected to another contact pad 36 of the die 26.

The microstrip conductive line 42, 44, 46 and the ground plane 58 may be arranged relative to each other, so as to form a microstrip line. The microstrip line 42, 44, 46, 58 may be used, for example, to transfer a high frequency signal. The high frequency signal may, for example, be above one gigahertz. For example, the die 26 may comprise a radar transmitter or a radar receiver. The die 26 may thus be arranged to receive or transmit a radar signal via the microstrip line 42, 44, 46, 58, and a substrate 6 and an antenna (not shown) connected to the substrate 6. The radar signal may, for example, have a frequency of about 77 gigahertz.

The microstrip line 42, 44, 46, 58 may be connected to the die 26 via a coplanar waveguide arranged in the second conductive layer 22. This will be explained in further detail by making additional reference to FIGS. 3 to 7.

Figure 3:
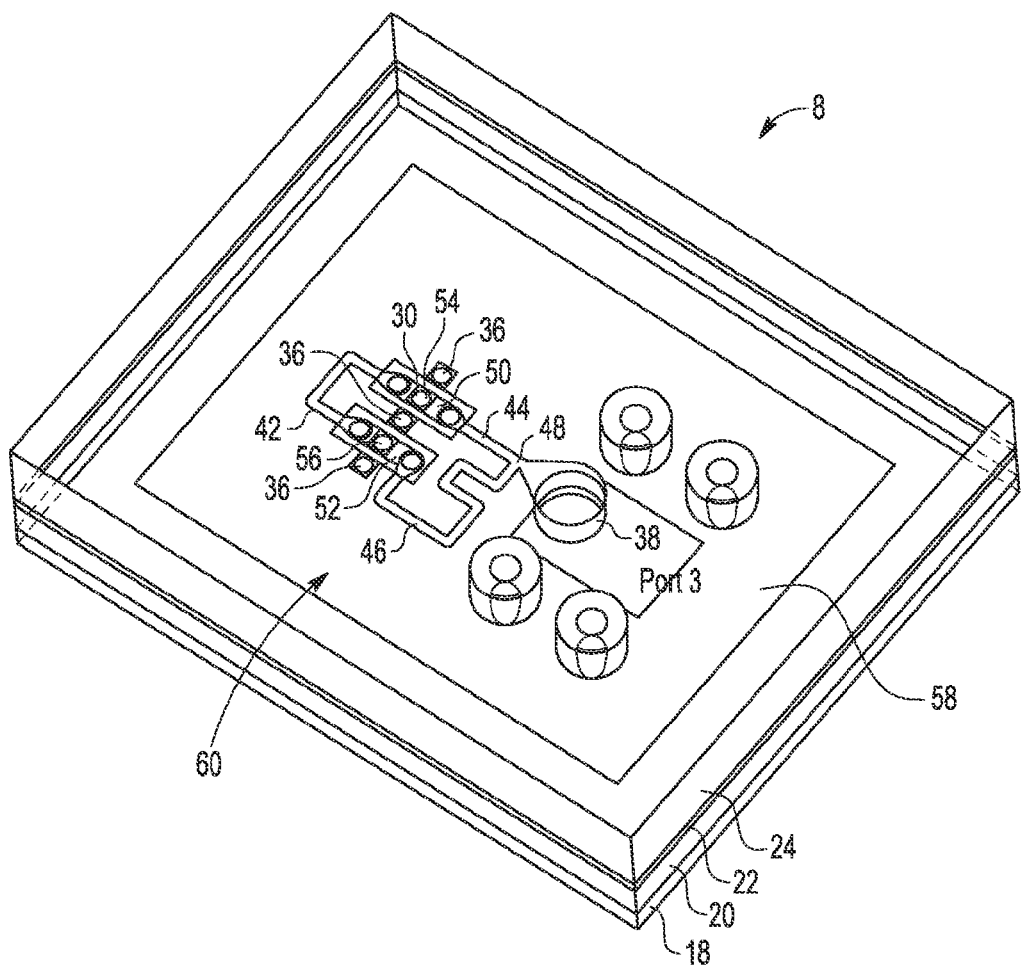
FIG. 3 schematically shows an example of an embodiment of a connection unit of the package of FIG. 1.
Figure 4:
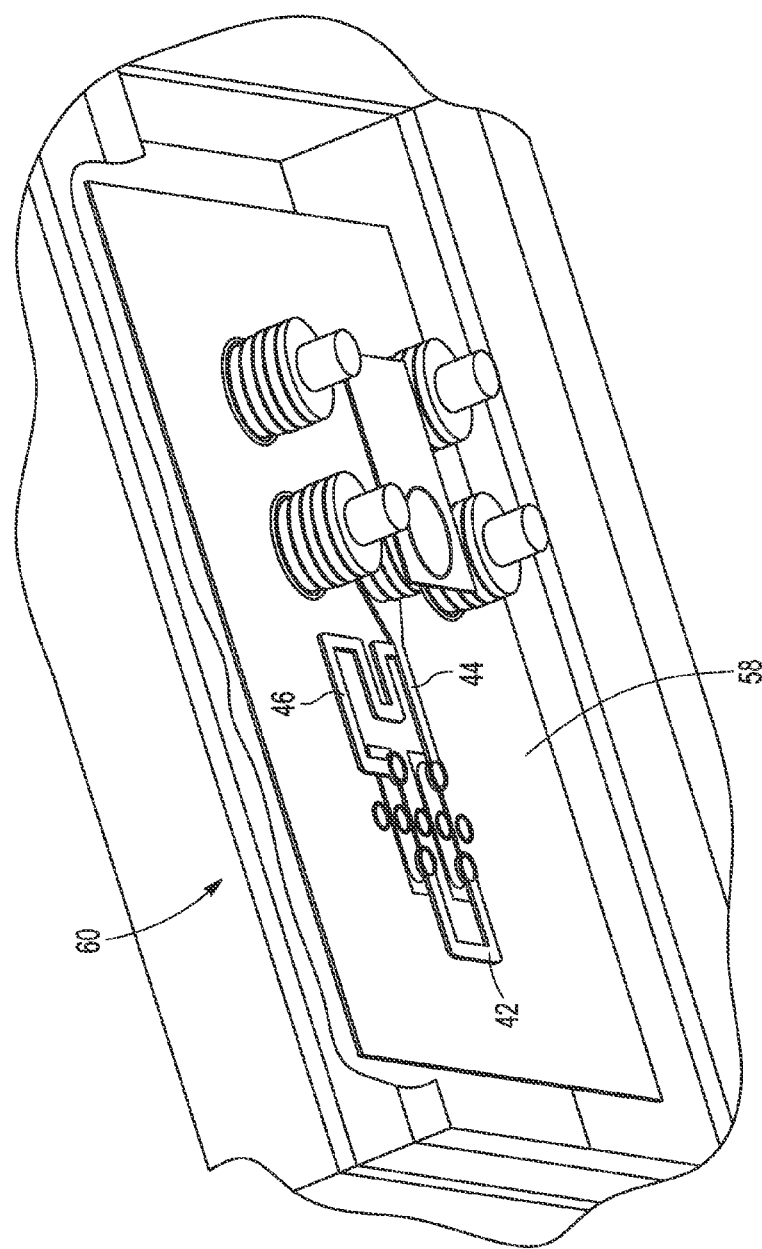
FIG. 4 schematically shows an example of an embodiment of the connection unit of FIG. 3.

FIG. 3 shows a schematic perspective top view of the connection unit 8 in accordance with the example of FIGS. 1 and 2. FIG. 4 shows a schematic perspective bottom view of the same connection unit 8. The second conduction layer 22 may comprise one or more coplanar conductive lines which, together with the ground plane 58, provide a coplanar waveguide. In the shown example, the second conduction layer 22 comprises a first coplanar conductive line 50 and a second coplanar conductive line 52. These two lines may be arranged substantially parallel to each other and may be separated from the surrounding ground plane 58 by a gap filled with, e.g., air or another isolating material. The coplanar conductive lines 50, 52 and the ground plane 58 may be coplanar, i.e., arranged in a common plane. The coplanar conductive lines 50 and 52 and the ground plane 58 may together form a coplanar waveguide 50, 52, 58. In the example, the coplanar conductive lines 50, 52 are entirely surrounded by the ground plane 58. More generally, they may be at least partly surrounded by the ground plane 58. The coplanar waveguide may, for example, be a ground-signal-ground-signal-ground coplanar waveguide (GSGSG). A GSGSG coplanar waveguide comprises two conductors (lines 52 and 50 in the example) surrounded by, but isolated from, a medium (ground plane 58 in the example) set at a bias potential.

The stack of layers 18, 20, 22, 24 may comprise one or more passive units. In the present example, the stack comprises a passive unit comprising the microstrip line 42, 44, 46, 58 and the coplanar waveguide 50, 52, 58. The passive unit may, for example, be a balun, a power divider, or a directional coupler. In the shown example, the microstrip line 42, 44, 46, 58 and the coplanar waveguide 50, 52, 58 together form a balun 60 for transforming a balanced signal into an unbalanced signal or vice versa. The coplanar waveguide 50, 52, 58 may be arranged to carry a balanced signal, while the microstrip line 42, 44, 46, 58 may be arranged to carry an unbalanced signal. In the example, the coplanar waveguide 50, 52, 58 and the microstrip line 42, 44, 46, 58 are connected to each other so as to convert the balanced signal into the unbalanced signal or vice versa. The signal may notably be a radio frequency signal, e.g., a radar signal. For example, a unbalanced signal may be received from a reception antenna (not shown), converted into a balanced signal in the connection unit 8 and further treated by a receiver circuit in the die 26. Alternatively or additionally, a balanced signal may be generated by a transceiver circuit in the die 26, converted into an unbalanced signal in the connection unit 8, and fed to a transmit antenna (not shown).

The balun 60 may be arranged, for example, as follows. The microstrip conductive lines 42, 44, 46 may comprise a first segment 42 and a second segment 44, 46. The first coplanar conductive 50 and the second coplanar conductive line 52 may be connected to each other at one end of the coplanar waveguide 50, 52, 58 by the first segment 42 and at the opposite end of the coplanar waveguide by the second segment 44, 46. The first segment 42 may have an electrical length of L/2, wherein L may be a wavelength of a signal to be transferred via the balun 60. The second segment may have an electrical length of L. For example, L may be the wavelength associated with a frequency of 77 gigahertz in the first segment and in the second segment, respectively. The second segment 44, 46 may comprise a third segment of electrical length L/4 and a fourth segment 46 of electrical length ¾*L. The third segment 44 and the fourth segment 46 may contact each other in a node 48 at which the unbalanced signal may be picked off or fed in. In other words, the node 48 may be arranged to transfer the unbalanced signal. An example of a "rat race coupler" is thus provided.

The first coplanar conductive line 50 and the second coplanar conductive line 52 may have a first contact point 52 and a second contact point 54, respectively. The balanced signal may be picked off or fed in at the contact points 52, 54. The first contact point 52 and the second contact point 54 may, for example, be the respective midpoints of the coplanar conductive lines 50 and 52. At these points, the coplanar conductive lines 50, 52 may be connected to the die 26.

It is noted that the coplanar waveguide 50, 52, 58 may be omitted if the first segment 42 is connected directly to the third segment 44 and to the fourth segment 46 of the microstrip conductive line. However, the coplanar waveguide 50, 52, 58 avoids the need of a direct transverse conductor between the microstrip conductive line 42, 44, 46 and the die 26 and may result in a more efficient transfer of a very high frequency signal between the substrate 6 and the die 26.

Figure 5:
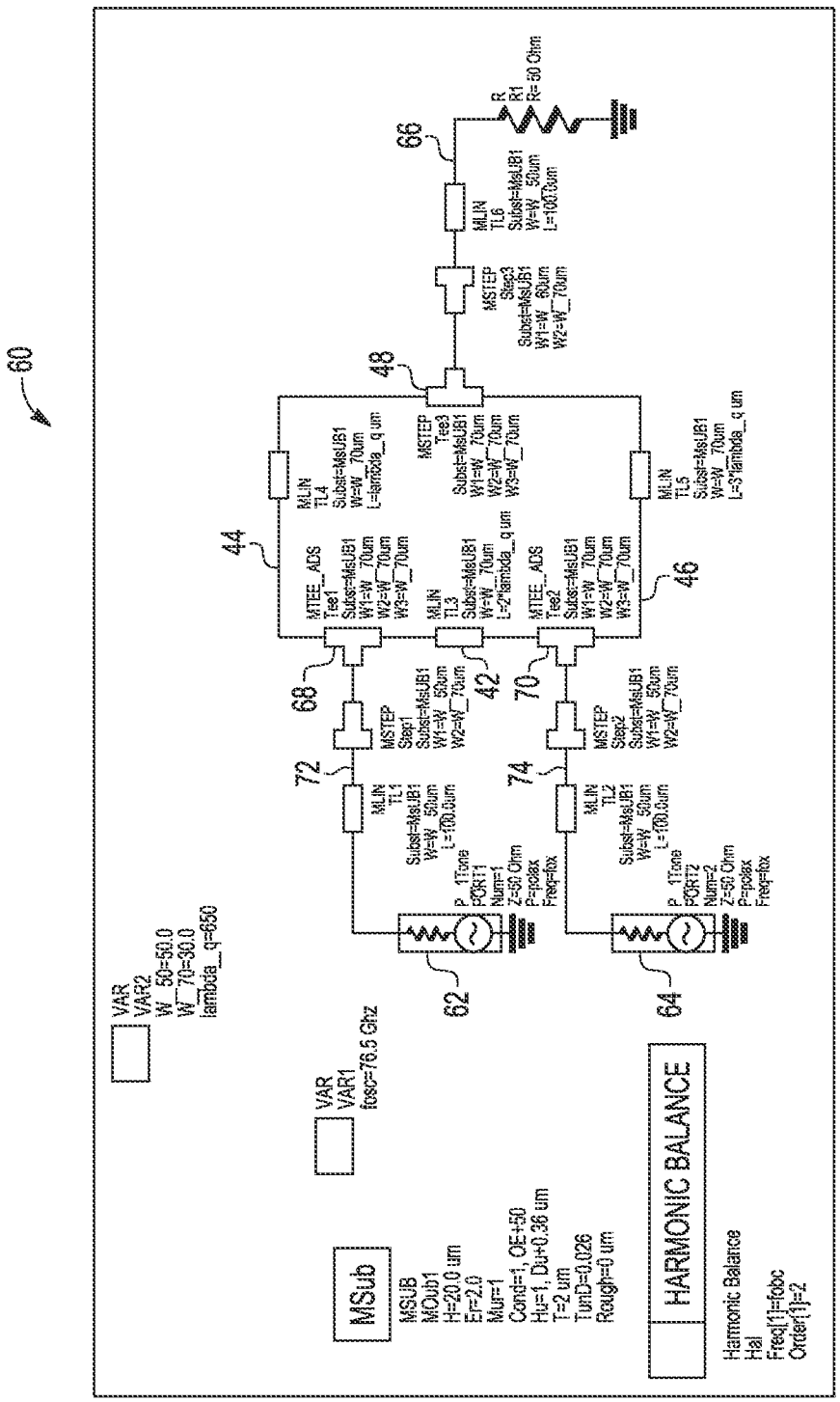
FIG. 5 schematically shows an example of an embodiment of a circuit diagram of a balun integrated in the connection unit of FIG. 3.

FIG. 5 shows a schematic circuit diagram of the balun 60 described above in reference to FIGS. 3 and 4. The die 26 may comprise a first port 62 and a second port 64 for receiving or delivering a balanced high frequency signal. The balanced signal may be defined as a difference between a voltage V1 (first voltage) at the first port 62 and a voltage V2 (second voltage) at the second port 64. This voltage may be an oscillatory, e.g., a sinusoidal, function of time. The voltage may oscillate about an average value. The average value may, for example, be the electrical potential of the ground plane 58.

The substrate 8 may comprise a third port 66. The third port 66 may be arranged to receive or deliver an unbalanced signal. The unbalanced signal may be a voltage V3 (third voltage) at the third port 66. V3 may oscillate about an average value different from the average value of V1 and V2. The third output port 66 may be connected to an antenna.

In the figures, the voltages V1, V2, and V3 are indicated as vinA, vinB, and vout, respectively.

The balun 60 may convert the balanced signal into the unbalanced signal as follows. The voltage V1 at the first port 62 and the voltage V2 at the second port 64 may be dephased relative to each other by 180 degrees. The first voltage V1 and the second voltage V2 may be transmitted to a first T junction 68 and to a section T junction 70, respectively, via a first connection 72 and second connection 74, respectively. The first connection 72 and the second connection 74 may have equal electrical lengths. The phase shift of, e.g., 180 degrees between the first voltage V1 and the second voltage V2 may thus be conserved as the voltages are transferred to the first T junction 68 and the second T junction 70. The phase difference between the first voltage V1 at the first T junction 68 and the second voltage V2 at the second T junction 70 may thus be 180 degrees, for example. The first voltage V1 may be further transferred to a third T junction provided by, for example, the node 48. The node 48 may also be referred to herein as the third T junction 48. The first T junction 68 may be connected to the third T junction 48 via the third segment 44 of the microstrip conductive line. The second T junction 70 may be connected to the third T junction 48 by the fourth segment 46 of the microstrip conductive line. The third segment 44 and the fourth segment 46 may have different electrical lengths. For example, their electrical lengths may differ by an odd multiple of the wavelength L of the respective electrical signal. In the example, the third segment 44 and the fourth segment 46 have electrical lengths of 1 and 3 quarters of the wavelength, respectively. The third segment 44 and the fourth segment 46 may thus generate a phase shift of, e.g., 180 degrees between the first voltage V1 and the second voltage V2. The resulting phase shift of V1 and V2 at the T junction 48 may thus be zero degrees, for example. The third T junction 48 may add the first voltage V1 and the second voltage V2. Their phase difference being, e.g., zero degrees, their amplitudes may add. The combined signal V3 (third voltage), i.e., the sum of V1 and V2, may be further transferred from the third T junction 48 to the third port 66 and further on to a transmit antenna.

The balun 60 may be operated reversely to transform an unbalanced signal received from, e.g., a receive antenna at the third port 66 into a balanced signal provided by a voltage difference between the first port 62 and the second port 64.

The first coplanar conductive line 50 (shown in FIGS. 3 and 4) may be connected between the first T junction 68 and the third segment 44, while the second coplanar conductive line 52 may be connected between the second T junction 70 and the fourth segment 46. Alternatively, the first and second coplanar conductive lines 50 and 52 may be integrated in the first connection 72 and the second connection 74, respectively.

Figure 6:
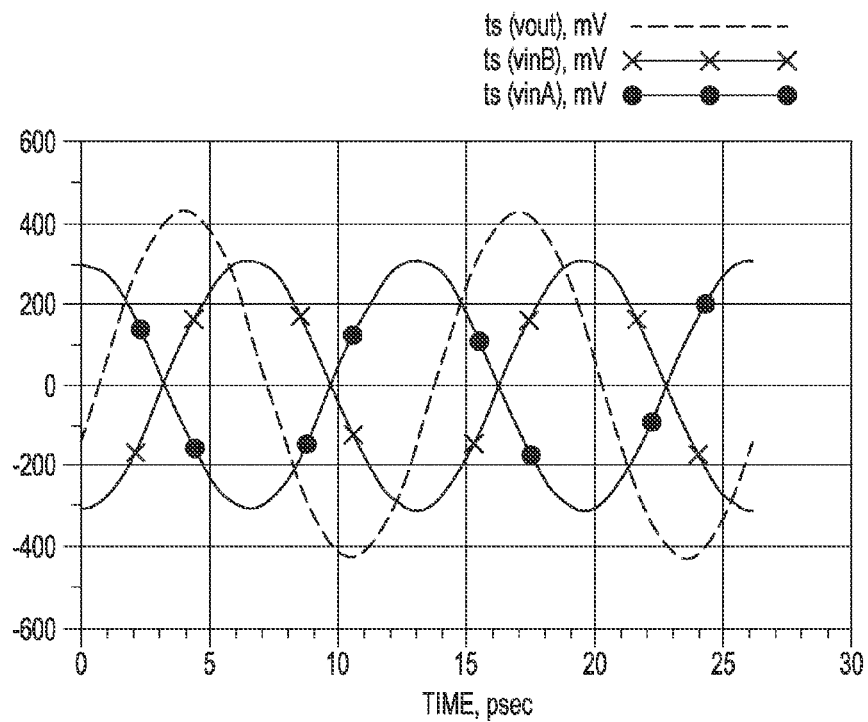
FIG. 6 schematically shows an example of an embodiment of a plot of a balanced signal fed to the balun of FIG. 5 and of an unbalanced signal output by the balun.

The plot in FIG. 6 illustrates, by way of example, a time dependence of the balanced signal at the first port 62 and the second port 64 and of the unbalanced signal at the third port 66. The balanced signal may be provided by the first voltage V1 (dotted line) in conjunction with the second voltage V2 (crossed line). The unbalanced signal may be represented by the third voltage V3 (continuous line). As seen in the plot, the first voltage V1 and the second voltage V2 may be dephased by 180 degrees. In the plot, the voltage V3 representing the unbalanced signal is shown to oscillate about a voltage level of zero. The zero level may correspond to the voltage of the ground plane 58. More generally, however, the voltage V3 may oscillate about an average value different from zero.

Figure 7:
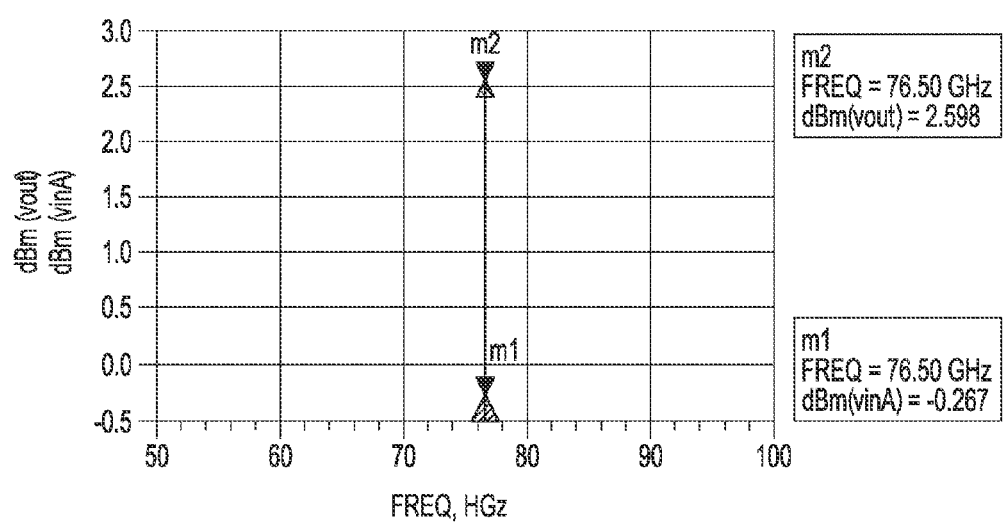
FIG. 7 schematically shows an example of an embodiment of a frequency spectrum of the balanced and unbalanced signals of FIG. 6.

FIG. 7 shows a plot illustrating, by way of example, a frequency spectrum observed for the balanced signal and the unbalanced signal, respectively. More specifically, the plot shows a Fourier transform of the first voltage V1 and of the third voltage V3, respectively, using a logarithmic scaling. The plot refers to an observation in which the balanced signal is generated from the unbalanced signal. In this case, the balanced signal may have a spectral width that may be somewhat enlarged in comparison to the spectral width of the unbalanced input signal. In the contrary case, i.e., in the case of generating the balanced signal from the unbalanced signal, the balanced signal may have a spectral width which may be enlarged compared to the spectral width of the unbalanced signal.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit package comprising:
   a substrate,
   one or more semiconductor dies, and
   a connection unit configured to provide electrical connections between said substrate and said one or more semiconductor dies, wherein, said connection unit comprises a stack comprising
      two or more conduction layers, including a first conduction layer and a second conduction layer and of one or more isolation layers stacked atop each other in an alternating manner, the first conduction layer comprising a microstrip conductive line, and the second conduction layer comprising a ground plane and one or more coplanar conductive lines, wherein said microstrip conductive line and said ground plane form a microstrip line and said one or more coplanar conductive lines and said ground plane form a coplanar waveguide.

2. The package of claim 1 wherein said second conduction layer is arranged between said first conduction layer and said one or more semiconductor dies.

3. The package of claim 1, said one or more coplanar conductive lines are at least partly surrounded by said ground plane.

4. The package of claim 1 wherein said stack further comprises a passive unit, said passive unit comprising at least one of said microstrip line and said coplanar waveguide.

5. The package of claim 4, wherein said passive unit comprises one of a balun, a power divider or a directional coupler.

6. The package of claim 1, wherein said coplanar waveguide is arranged to carry a balanced signal.

7. The package of claim 6 wherein said coplanar waveguide and said microstrip line are connected to each other and arranged to form a balun for converting said balanced signal into an unbalanced signal and vice versa.

8. The package of claim 7 wherein said one or more coplanar conductive lines comprise:

a first coplanar conductive line and a second coplanar conductive line connected to each other at one end of said coplanar waveguide by a first segment and at another end of said coplanar waveguide by a second segment of said microstrip conductive line.

9. The package of claim 8 wherein said first segment and said second segment have an electrical length of L/2 and L, respectively, L being a dimension of the electrical length.

10. The package of claim 9 wherein said second segment comprises a third segment of electrical length L/4 and a fourth segment of electrical length 3/4*L contacting each other in a node, and said node is arranged to transfer said unbalanced signal.

11. The package of claim 9, wherein the dimension L is based upon a wavelength of a signal to be transferred via said balun.

12. The package claim 1 further comprising one or more transverse conductors arranged to interconnect the two or ore conduction layers of said stack.

13. The package claim 1 wherein said one or more semiconductor dies comprises a radar receiver circuit or a radar transmitter circuit.

14. The package of claim 1 wherein said substrate comprises a printed circuit board.

* * * * *